United States Patent
Wen

[19]
[11] Patent Number: 6,087,904
[45] Date of Patent: Jul. 11, 2000

[54] AMPLITUDE MODULATION AND AMPLITUDE SHIFT KEYING CIRCUIT

[75] Inventor: Zhongmin Wen, Tokyo, Japan

[73] Assignee: Oki Electric Industry Co., Ltd., Tokyo, Japan

[21] Appl. No.: 09/163,476

[22] Filed: Sep. 30, 1998

[30] Foreign Application Priority Data

Dec. 8, 1997 [JP] Japan .................................. 9-336239

[51] Int. Cl.[7] .............................. H03C 1/36; H03C 1/38; H03C 1/40
[52] U.S. Cl. ........................................... 332/178; 332/149
[58] Field of Search .................................. 332/106, 149, 332/178

[56] References Cited

U.S. PATENT DOCUMENTS

| 3,484,723 | 12/1969 | Rypkema | 332/178 X |
| 5,680,078 | 10/1997 | Ariie | 332/178 |

OTHER PUBLICATIONS

Charles A. Liechti, "Performance of Dual–Gate GaAs Mesfet's as Gain–Controlled Law–Noise Amplifiers and High–Speed Modulators", IEEE Transactions on Microwave Theory and Techniques, pp. 461–468, Jun. 1973.

Practical Electronic Circuit Handbook I, 1997 CQ Shuppansha, Chapter 3: High Frequency Circuit, High Frequency Practical Circuit, pp. 228–229.

*Primary Examiner*—David Mis
*Attorney, Agent, or Firm*—Jones Volentine, LLP

[57] ABSTRACT

The present invention provides a modulation circuit that has excellent modulation characteristics and can be designed as an MMIC. Consequently, this modulation circuit is such that the modulating wave input means is composed of a capacitor 21 and an inductor 22, the carrier input means is composed of a capacitor 23 and a resistance element 24, the self-bias means is composed of a resistance element 26 and a capacitor 27, the carrier selection means is composed of an inductor 22 and a capacitor 28, and the modulated wave output means is composed of a capacitor 28.

16 Claims, 7 Drawing Sheets

AMPLITUDE MODULATION AND AMPLITUDE SHIFT KEYING CIRCUIT

BACKGROUND OF THE INVENTION

1. Field of the Invention

The present invention relates to a modulation circuit, and more particularly to an integrated modulation circuit. This invention can, for example, be applied to a modulation circuit designed as an MMIC (Monolithic Microwave Integrated Circuit). MMIC modulation circuits can, for example, be used for ETC (Electronic Toll Collection) or the like in an. ITS (Intelligent Transit System).

2. Description of the Related Art

The structure of a common conventional modulation circuit is described using the circuit diagram of FIG. 1.

In the modulation circuit depicted in FIG. 1, a carrier $S_2$ is inputted via a transformer 1, fed to the base of a bipolar transistor 2, and amplified by this bipolar transistor 2. A modulating wave (data signal) $S_1$ is inputted via a transformer 3 and is applied to the collector of the bipolar transistor 2. The output of the carrier $S_2$. amplified by the-bipolar transistor 2, is controlled by the modulating wave $S_1$. Specifically, a modulated wave $V_{out}$ is generated due to the modulation of the carrier $S_2$ with the modulating wave $S_1$. The modulated wave $V_{out}$ is outputted from the modulation circuit via a transformer 4.

The modulation circuit depicted in FIG. 1 is difficult to design as an MMIC because of the use of the transformers 1, 3, and 4. This is the reason that separate elements are commonly used as the transformers 1, 3, and 4 and as the bipolar transistor 2 of this modulation circuit. Consequently, such a modulation circuit is disadvantageous in that it has considerable dimensions and entails high manufacturing costs.

In addition, the frequency of a carrier $S_2$ that can be used in such a modulation circuit is approximately several tens of megahertz. The modulation circuit is therefore disadvantageous in that it cannot be used in systems employing other frequency bands. For example, ETC systems operate in a 5.8-GHz band, making it impossible to use this modulation circuit.

The following report describes other types of modulation circuits.

IEEE TRANSACTIONS ON MICROWAVE THEORY AND TECHNIQUES, MTT-23, No. 6, June 1975 (USA), C. A. Liechti, p. 461.

In the modulation circuits described in this report, the carrier $S_2$ is modulated using dual-gate field-effect transistors.

A drawback of these modulation circuits, however, is that power leaks into adjacent channels because of a considerable nonlinearity of modulation characteristics (relation between the modulated wave $V_{out}$ and the modulating wave $S_1$).

SUMMARY OF THE INVENTION

An object of the present invention is to provide a modulation circuit in which signals can be directly inputted and outputted without the use of transformers, that is, a modulation circuit that can be easily designed as an MMIC.

Another object of the present invention is to provide a modulation circuit having linear modulation characteristics, that is, a modulation circuit in which power leakage to adjacent channels is reduced.

For this reason, the modulation circuit in accordance with the present invention comprises carrier input means for directly inputting a carrier to a carrier input terminal; a transistor for inputting the carrier inputted by the carrier input means to a control terminal, amplifying the carrier, and outputting the result to a first terminal; modulating wave input means for directly inputting a modulating wave to a modulating wave input terminal and feeding the modulating wave to the first terminal of the transistor while preventing the carrier from being transmitted; self-bias means for setting the bias potential of the transistor; carrier selection means for selectively extracting the amplified carrier from the first terminal of the transistor; and modulated wave output means for sampling the modulated wave from the carrier selectively extracted by the carrier selection means, and outputting the result directly to a modulated wave output terminal.

BRIEF DESCRIPTION OF THE DRAWINGS

Other objects and advantages of the present invention are described with reference to the following accompanying drawings.

DESCRIPTION OF THE PREFERRED EMBODIMENTS

First Embodiment

First, the modulation circuit pertaining to a first embodiment of the present invention will be described using FIGS. 2–5.

Figure 2:
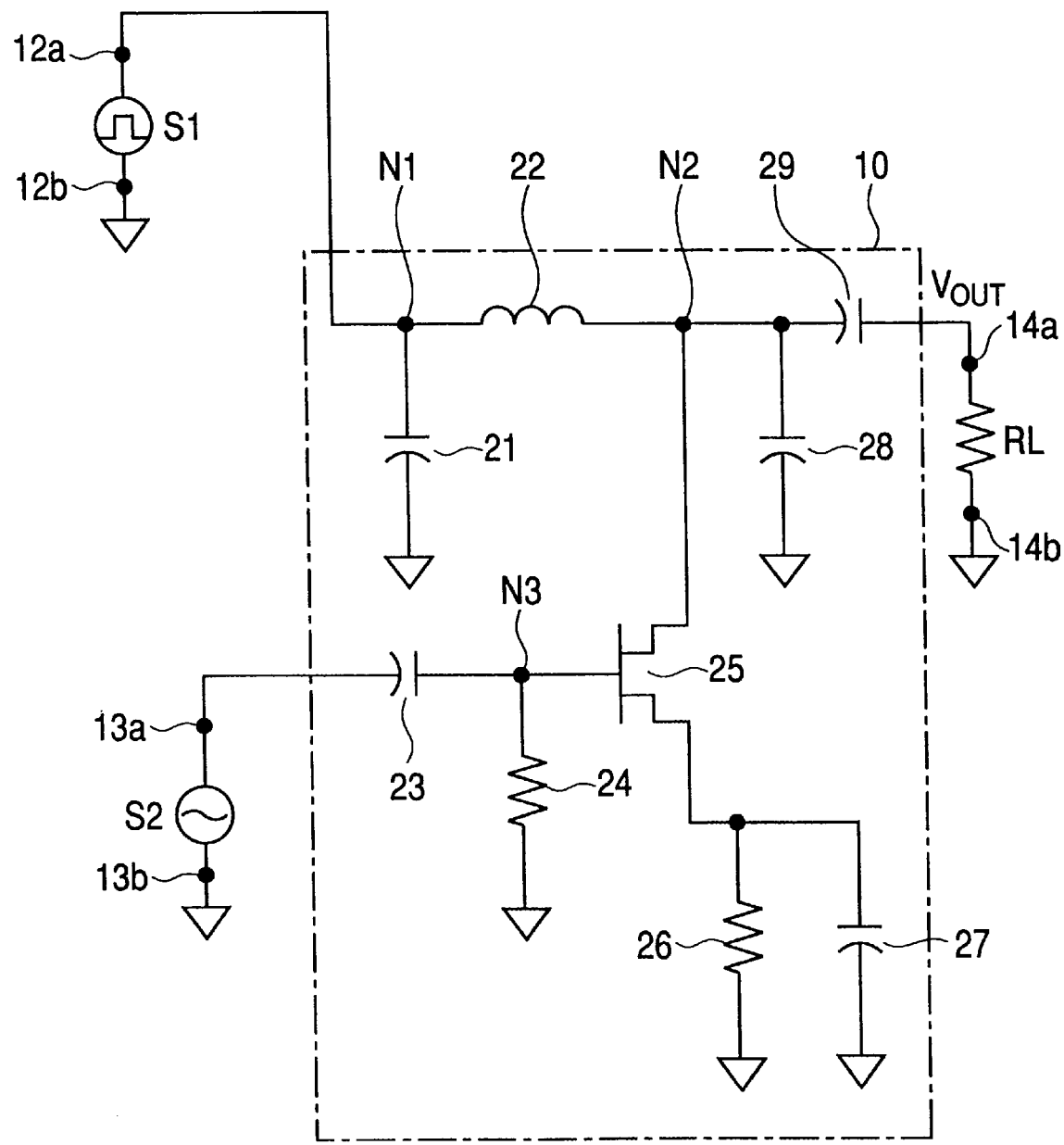
FIG. 2 is a circuit diagram depicting the structure of the modulation circuit in accordance with a first embodiment.

In the modulation circuit 10 depicted in FIG. 2, input terminals 12a and 12b are terminals for inputting a pulse signal serving as a modulating wave $S_1$ from the outside. The input terminal 12a is connected via a node $N_1$ to one end of a capacitor 21 and to one end of an inductor 22. The input terminal 12b is grounded.

Input terminals 13a and 13b are terminals for inputting a sine wave serving as a carrier $S_2$ from the outside. The input terminal 13a is connected to one end of the a capacitor 23. The input terminal 13b is grounded.

Output terminals 14a and 14b are terminals for outputting a modulated wave $V_{out}$ generated by the modulation circuit 10, and feeding the wave to an outside load RL. The output terminal 14a is connected to one end of a capacitor 29. The output terminal 14b is grounded.

The capacitor 21 and the inductor 22 constitute a modulating wave input means. The other end of the capacitor 21 is grounded. The other end of the inductor 22 is connected to the drain of a field-effect transistor (FET) 25 via a node $N_2$. The capacitance of the capacitor 21 is set such that it represents a large resistance for the modulating wave $S_1$ (for example, several megahertz) and a small resistance for the carrier $S_2$ (for example, several gigahertz to several tens of gigahertz). In addition, the inductance of the inductor 22 is set such that it represents a small resistance for the modulating wave $S_1$ and a large resistance for the carrier $S_2$. The presence of the modulating wave input means prevents the carrier $S_2$ from being transmitted to the input terminal 12a.

The capacitor 23 and a resistor 24 constitute a carrier input means. The other end of the capacitor 23 is connected to the gate of the FET 25 via node $N_3$. One end of the resistor 24 is connected to the node $N_3$, and the other end thereof is grounded. The capacitor 23 is used as a coupling capacitor, and the resistor 24 is used to maintain the base potential of the FET 25.

A resistor 26 constitutes a self-bias means. One end of the resistance element 26 is connected to the source terminal of the FET 25, and the other end thereof is grounded. The bias of the FET 25 is set by the resistance value of the resistor 26.

One end of a capacitor 27 is connected to the source terminal of the FET 25, and the other end thereof is grounded. The capacitor 27 is used as a bypass capacitor. Specifically, the source of the FET 25 is grounded by the capacitor 27 with respect to alternating current.

The inductor 22 and a capacitor 28 constitute a carrier selection means. Specifically, the inductor 22 constitutes part of the modulating wave input means and part of the carrier selection means. One end of the capacitor 28 is connected to the node $N_2$, and the other end thereof is grounded. The elements 22 and 28, operating as a resonant circuit, select the carrier amplified by the FET 25 and feed the result to the capacitor 29.

The capacitor 29 constitutes a modulated wave output means. One end of the capacitor 29 is connected to the node $N_2$, and the other end thereof is connected to the output terminal 14a. The capacitor 29 is used as a coupling capacitor.

The operation of the modulation circuit 10 depicted in FIG. 2 will now be described using FIGS. 3 and 4.

Figure 3:
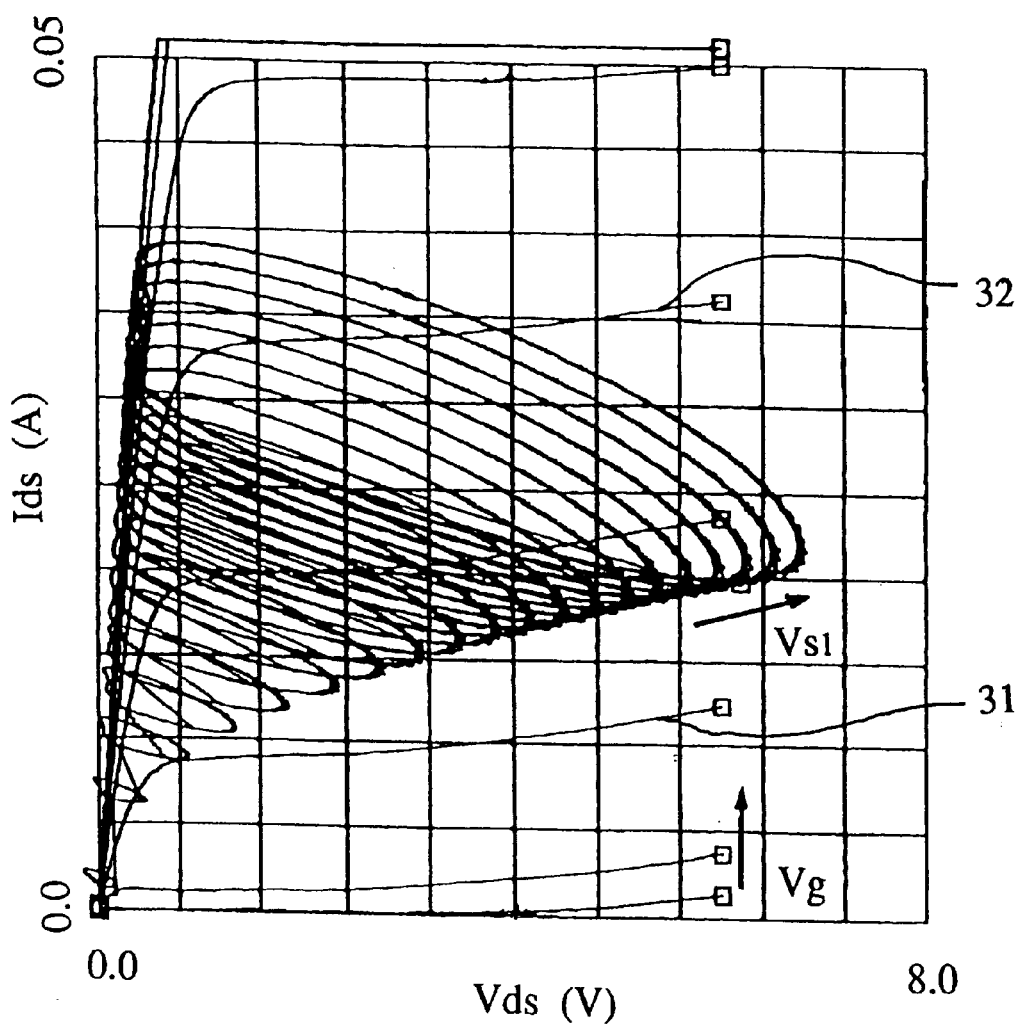
FIG. 3 is an operating characteristic diagram of the modulation circuit in accordance with the first embodiment.

FIG. 3 is a graph depicting the results of simulating the operation of the modulation circuit 10, with the current $I_{ds}$ between the drain and source of the FET 25 being plotted on the vertical axis, and the voltage $V_{ds}$ between the drain and source of the FET 25 on the horizontal axis. This simulation was conducted using an MDS (Microwave Design System). In addition, curve 31 in FIG. 3 represents the direct-current characteristics of an FET, and curve 32 is the load curve of the carrier $S_2$.

Figure 4:
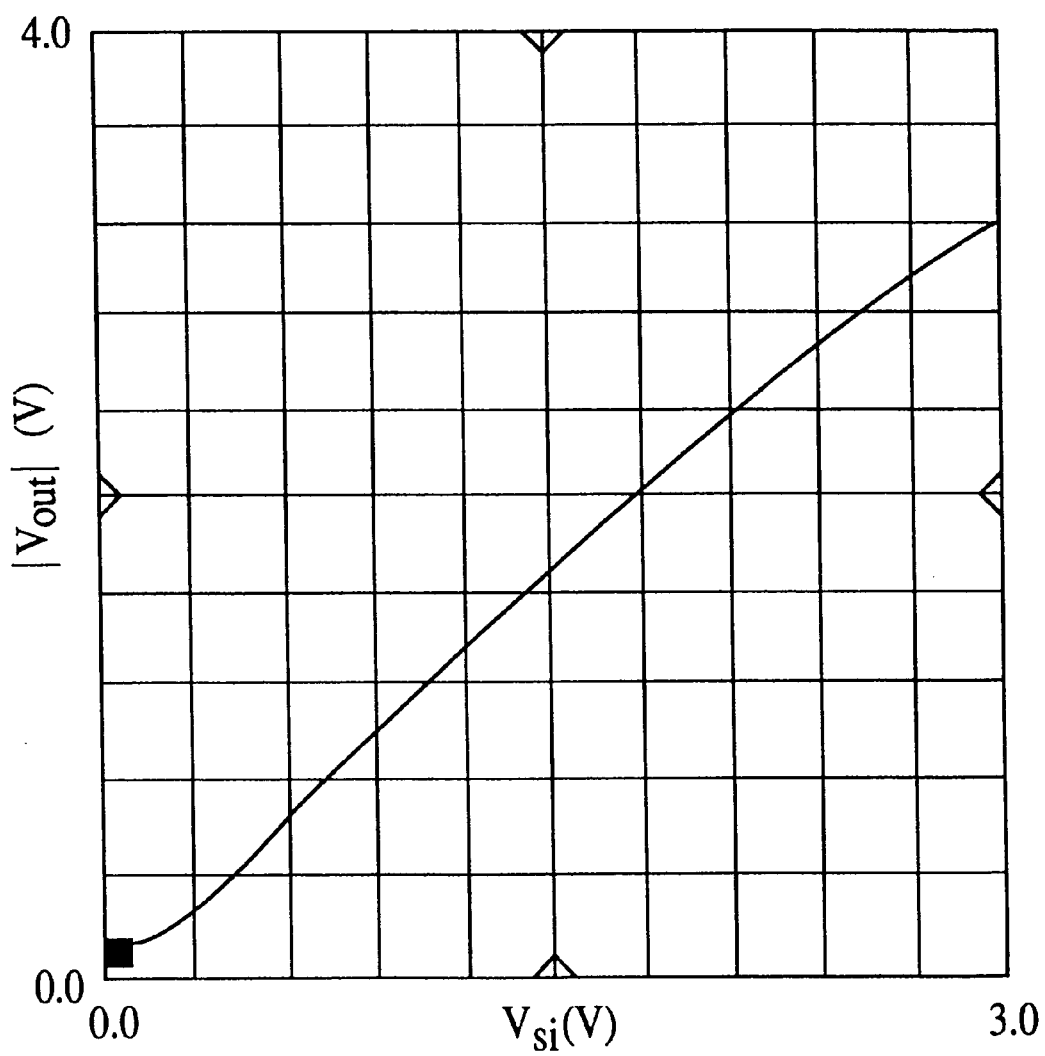
FIG. 4 is a modulation characteristic diagram of the modulation circuit in accordance with the first embodiment.

FIG. 4 is a graph depicting the modulating wave output of the modulation circuit 10, with the potential $V_{out}$ of the modulating wave being plotted on the horizontal axis, and the potential $V_{s1}$ of the modulating wave on the horizontal axis.

The carrier $S_2$ (for example, a sine-wave signal of several gigahertz to several tens of gigahertz) that has been inputted to the input terminals 13a and 13b is fed to the base of the FET 25 via the capacitor 23. In addition, the modulating wave $S_1$ (for example, a pulse signal of several megahertz) that has been inputted to the input terminals 12a and 12b is fed to the drain of the FET 25 via the inductor 22. The modulating wave $S_1$ and the carrier $S_2$ are thereby superposed in accordance with the same operating principle as that of a common modulation circuit, making it possible to generate a modulated wave $V_{out}$.

Operating characteristics such as those shown in FIG. 3 can be obtained by setting the resistance of the resistor 26 and the capacitance of the capacitor 27 in an appropriate manner. It can be seen in FIG. 3 that when the potential of the modulating wave $S_1$ in the modulation circuit 10 reaches its maximum value, the load curve 32 of the carrier $S_2$ describes a figure other than an elliptical curve, indicating that the FET 25 is in a saturated state. On the other hand, when the potential of the modulating wave $S_1$ approaches its minimum value, the load curve 32 moves in the direction of the origin in FIG. 3, and although both the current $I_{ds}$ between the drain and source of the FET 25 and the voltage $V_{ds}$ between the drain and source decrease, the FET 25 is still in a saturated state. Thus, the FET 25 in the modulation circuit 10 in FIG. 1 can constantly operate in a saturated state irrespective of whether the modulating wave $S_1$ assumes its maximum or minimum value. The modulation circuit 10 can therefore yield substantially linear, undistorted modulation characteristics such as those depicted in FIG. 4.

The modulated wave $V_{out}$ thus generated is outputted to the output terminals 14a and 14b via the capacitor 29, and is applied to the load RL.

Figure 1:
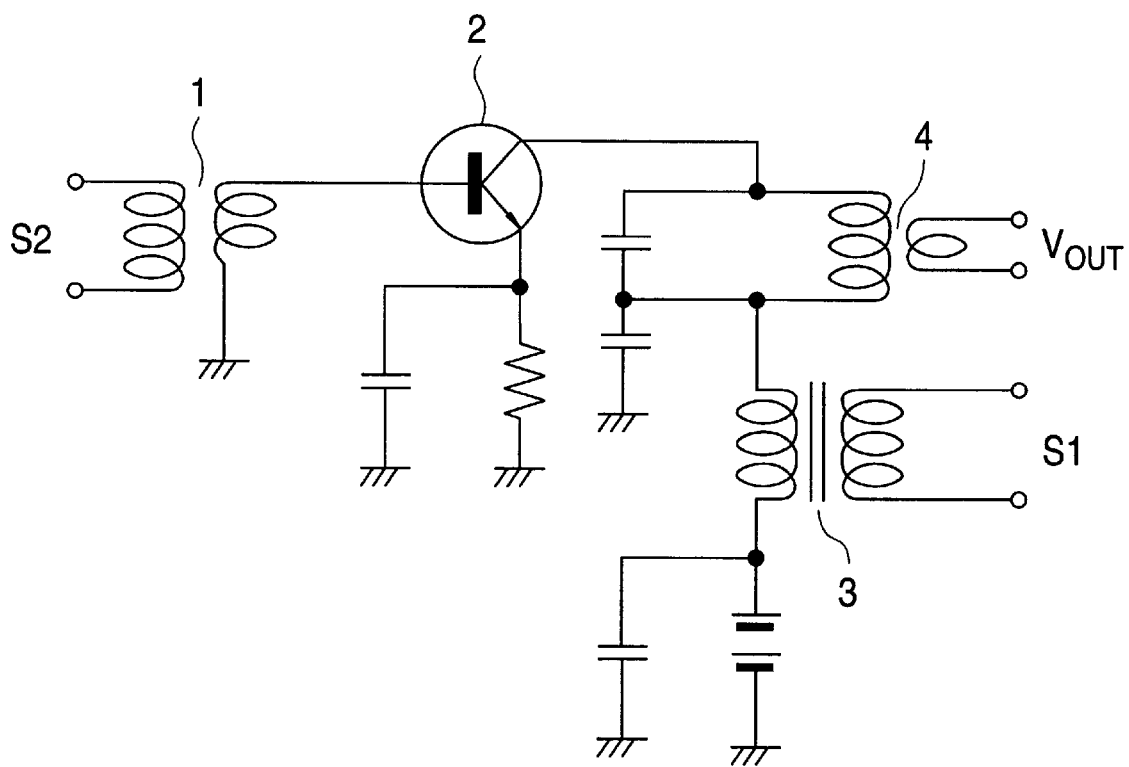
FIG. 1 is a circuit diagram depicting the structure of a conventional modulation circuit.
Figure 5:
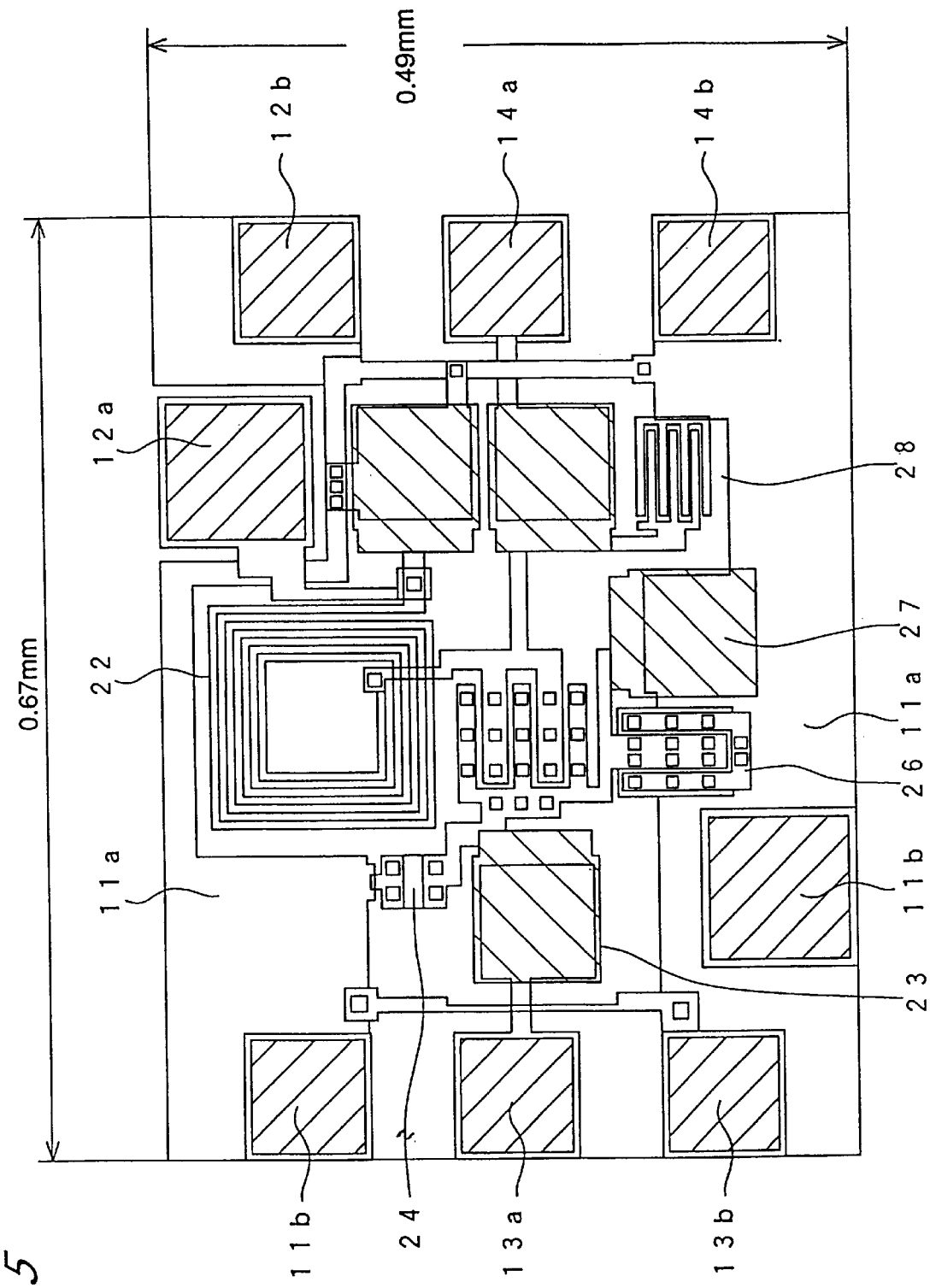
FIG. 5 is a plan view schematically depicting an example of an MMIC layout for the modulation circuit in accordance with the first embodiment.

The modulation circuit 10 depicted in FIG. 1 can be easily designed as an MMIC. FIG. 5 illustrates an example of a CAD (Computer Aided Design) layout of an MMIC pertaining to the modulation circuit 10. In FIG. 5, the parts assigned the same symbols as in FIG. 1 depict the same elements as in FIG. 1. In addition, in FIG. 5, 11a is ground wiring, and 11b is a ground pad.

The modulation circuit 10 can, for example, be formed on a gallium/arsenic (GaAs) semiconductor substrate. The overall dimensions of the integrated circuit is 0.67 mm×49 mm, including the input terminals and the output terminals. The ground wiring 11a can, for example, be formed from gold (Au). MIM capacitors can be used, for example, as the capacitors 21, 23, 27, and 29. An interdigital capacitor can, for example, be used as the capacitor 28. A spiral inductor can, for example, be used as the inductor 22; and np junctions can, for example, be used as the resistance elements 24 and 26. A GaAs-semiconductor MES (Metal Semiconductor) FET can, for example, be used as the FET 25.

The modulation circuit 10 pertaining to this embodiment has the following effects.

First, the modulation circuit 10 is designed for modulation with a modulating wave $S_1$ through the use of a drain modulation system, making it possible to achieve linear modulation in the range of large signals. In addition, the modulation circuit 10 can yield substantially linear modulation characteristics even when a large signal is directly used as the modulating wave $S_1$. This reduces the probability that power will leak to adjacent channels. In addition, achieving substantially linear modulation characteristics makes it possible to dispense with the use of amplifier circuits in a communications system by employing the modulation circuit 10 as the transmitting component or another part of the communications system.

Second, the modulation circuit 10 is such that the modulating wave input means comprises a capacitor 21 and an inductor 22, the carrier input means comprises a capacitor 23 and a resistor 24, and the modulated wave output means comprises a capacitor 29. This is the reason that, as shown in FIG. 5, the FET 25 can be composed, for example, of a GaAs MESFET, whereby a microwave (for example, several gigahertz to several tens of gigahertz) carrier $S_2$ can be directly modulated with a low-frequency (for example, several megahertz) modulating wave $S_1$. Modulation circuits for intermediate frequencies are thus rendered unnecessary.

Third, circuits can be miniaturized and their costs reduced by designing the modulation circuit 10 as an MMIC.

The modulation circuit pertaining to this embodiment can be used in vehicle-mounted communications systems, satellite systems, applications involving mobile vehicle communication, and various other fields.

Second Embodiment

Next, the modulation circuit pertaining to a second embodiment of the present invention will be described using FIGS. 6 and 7.

Figure 6:
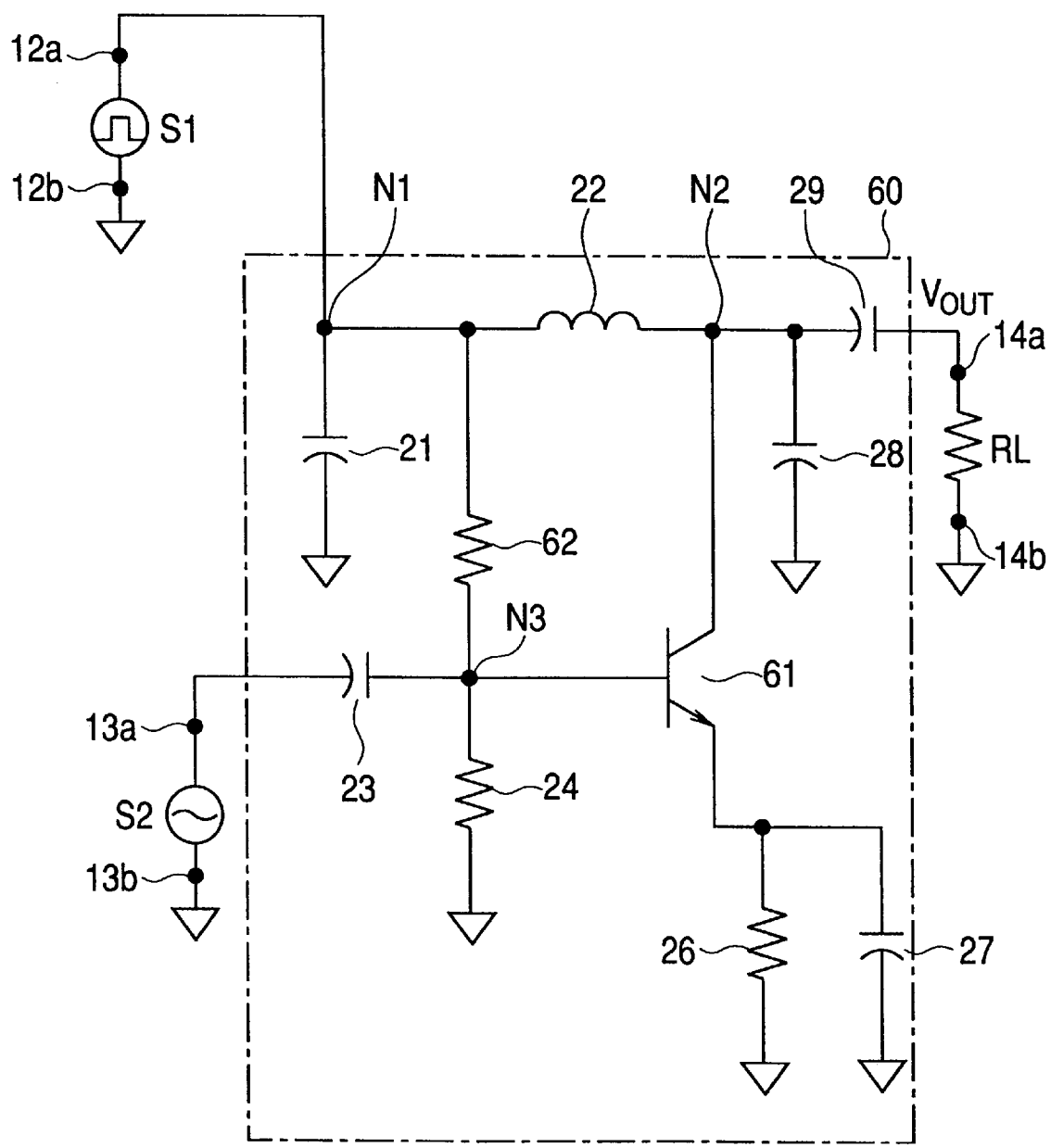
FIG. 6 is a circuit diagram depicting the structure of the modulation circuit in accordance with the second embodiment.

In the modulation circuit 60 depicted in FIG. 6, the parts assigned the same symbols as in FIG. 2 depict the same elements as in FIG. 2.

In the modulation circuit of this embodiment, a bipolar transistor 61 is used for the modulation transistor. An npn device formed, for example, on a silicon substrate can be used as the bipolar transistor 61. As shown in FIG. 6, a modulating wave $S_1$ is inputted to the collector of the bipolar transistor 61 via an inductor 22, and a carrier $S_2$ is inputted to the base via a capacitor 23.

Resistance elements 62, 24, and 26 constitute a self-bias means. Specifically, the resistance element 24 constitutes part of a carrier input means and part of the self-bias means. One end of the resistance element 62 is connected to a node $N_1$, and the other end thereof is connected to the base of the bipolar transistor 61 via a node $N_3$. One end of the resistance element 24 is connected via the node $N_3$ to the base of the bipolar transistor 61, and the other end thereof is grounded. One end of the resistance element 26 is connected to the emitter of the bipolar transistor 61, and the other end thereof is grounded. An arbitrary bias can be set for the base of the bipolar transistor 61 by appropriately setting the resistance values of the resistance elements 62, 24, and 26.

The operation of the modulation circuit 60 depicted in FIG. 6 will now be described using FIG. 7.

In FIG. 7, $V_{cc}$ is the voltage of the modulating wave $S_1$, $V_{ce}$ is the voltage between the collector and emitter of the bipolar transistor 61, $I_c$ is the collector current of the bipolar transistor 61, $I_b$ is the base current of the bipolar transistor 61, t is time, and symbol 33 designates a load line for the carrier $S_2$.

A modulating wave $S_1$ inputted to the input terminals 12a and 12b passes through a capacitor 21 and an inductor 22 and reaches the collector of the bipolar transistor 61. A modulating voltage $V_{cc}$ is thereby applied to the collector of the bipolar transistor 61.

Meanwhile, a carrier $S_2$ is inputted to the base of the bipolar transistor 61 via the capacitor 23. The carrier $S_2$ is thereby amplified by the bipolar transistor 61 and is outputted to the collector.

Figure 7A:
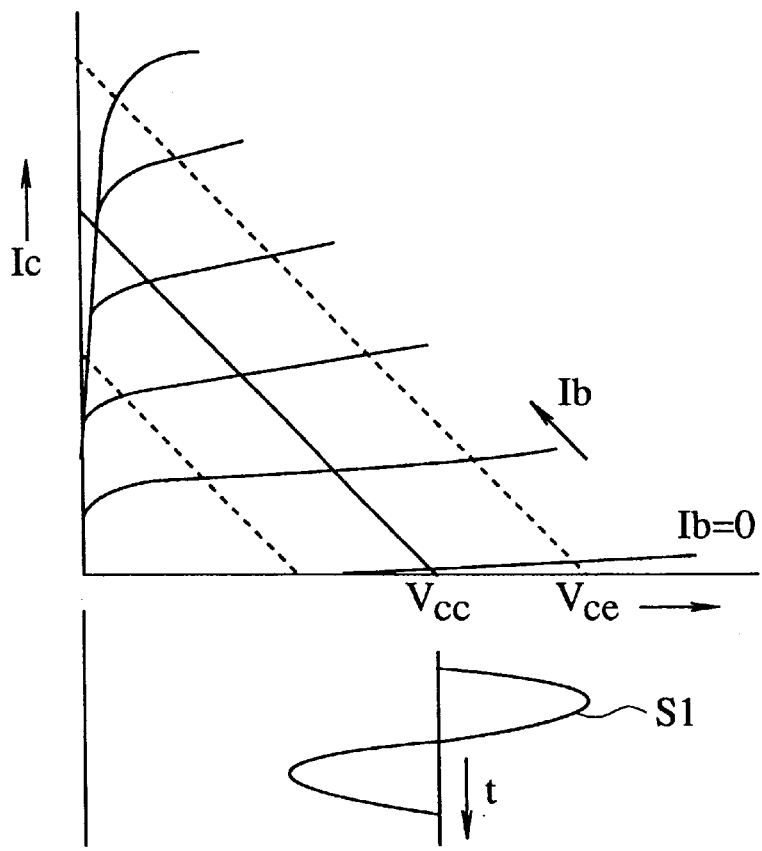
FIGS. 7(A) and 7(B) is an operating characteristic diagram of the modulation circuit in accordance with the second embodiment.
Figure 7B:
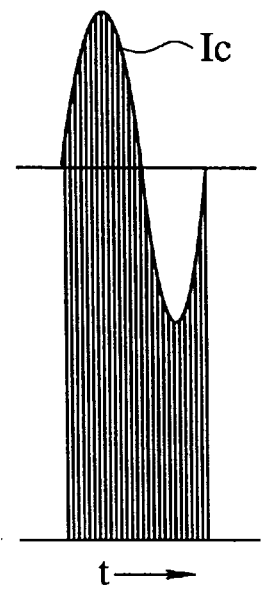

The collector voltage is controlled by the modulating voltage $V_{cc}$. At this time, the load line 33 varies in accordance with changes in the modulating voltage $V_{cc}$, as shown in FIG. 7(A). As a result, the peak value of the collector current $I_c$ varies in accordance with the changes in the modulating voltage $V_{cc}$, as shown in FIG. 7(B). The collector current $I_c$ becomes a modulated current.

The modulated current is selected as a modulated voltage $V_{out}$ by a carrier selection means (composed of an inductor 22 and a capacitor 28). This modulated voltage $V_{out}$ is outputted to output terminals 14a and 14b through to a capacitor 29, and is applied to a load RL.

The modulation circuit 60 depicted in FIG. 6 can yield the same effects as the modulation circuit 10 depicted in FIG. 1.

In addition, this embodiment allows an MMIC direct-modulation circuit 60 to be manufactured using a silicon substrate and a silicon bipolar transistor 61. Since the transistor substrate costs constitute most of the manufacturing costs of an MMIC, the manufacturing costs can be greatly reduced through the use of a silicon bipolar transistor.

The present invention is not limited by the above-described embodiments, and various modifications or types of application are also permitted.

For example, an MESFET was used as the FET 25 in the first embodiment, but an HEMT (High Electron Mobility Transistor), MOS (Metal Oxide Semiconductor) FET, or the like can also be used for this purpose.

Although an npn bipolar transistor 61 was used in the second embodiment, it is also possible to use a pnp transistor by changing the polarity or the like of the power supply.

In the first and second embodiments, the structures of the carrier input means, modulating wave input means, and modulated wave output means are not limited to those depicted in FIGS. 1 and 6. It is possible, for example, to compose these structures using a plurality of inductors or capacitors, or to compose these structures using distributed transmission lines or the like.

Although in the first embodiment the operating characteristics were simulated using 5.8 GHz as the frequency of the carrier $S_2$ (see FIG. 3), this invention may also be implemented, for example, within the entire microwave band or within the millimeter waveband.

What is claimed is:

1. A modulation circuit, comprising:

carrier input means for directly inputting a carrier to a carrier input terminal;

a transistor for inputting the carrier inputted by the carrier input means to a control terminal, amplifying the carrier, and outputting the result to a first terminal;

modulating wave input means for directly inputting a modulating wave to a modulating wave input terminal and feeding the modulating wave to said first terminal of said transistor while preventing said carrier from being transmitted;

self-bias means for setting the bias potential of said transistor;

carrier selection means having a parallel resonant circuit for selectively extracting said amplified carrier from said first terminal of said transistor; and modulated wave output means for extracting the modulated wave from said carrier selectively extracted by the carrier selection means, and outputting the result directly to a modulated wave output terminal.

2. The modulation circuit according to claim 1, wherein said transistor is a field-effect transistor, said control terminal is a gate terminal, and said first terminal is a drain terminal.

3. The modulation circuit according claim 2, wherein said carrier input means comprises a capacitor, one end of which is connected to said carrier input terminal, and the other end of which is connected to said gate terminal of said field-effect transistor; and a resistance element, one end of which is connected to said gate terminal of said field-effect transistor, and the other end of which is grounded.

4. The modulation circuit according claim 2, wherein said modulating wave input means comprises a capacitor, one end of which is connected to said modulating wave input terminal, and the other end of which is grounded; and an inductor, one end of which is connected to said modulating wave input terminal, and the other end of which is connected to said drain terminal of said field-effect transistor.

5. The modulation circuit according claim 2, wherein said self-bias means comprises a resistance element one end of which is connected to the source terminal of said field-effect transistor, and the other end of which is grounded.

6. The modulation circuit according to claim 2, comprising a bypass capacitor one end of which is connected to the source terminal of said field-effect transistor, and the other end of which is grounded.

7. The modulation circuit according to claim 2, wherein said carrier selection means comprises an inductor, one end of which is connected to said modulating wave input terminal, and the other end of which is connected to said drain terminal of said field-effect transistor; and a capacitor, one end of which is connected to said drain terminal of said field-effect transistor, and the other end of which is grounded.

8. The modulation circuit according to claim 2, wherein said modulated wave output means comprises a capacitor one end of which is connected to said drain terminal of said field-effect transistor, and the other end of which is connected to said modulated wave output terminal.

9. The modulation circuit according to claim 1, wherein said transistor is a bipolar transistor, said control terminal is a base terminal, and said first terminal is a collector terminal.

10. The modulation circuit according to claim 9, wherein said carrier input means comprises a capacitor, one end of which is connected to said carrier input terminal, and the other end of which is connected to said base terminal of said bipolar transistor; and a resistance element, one end of which is connected to said base terminal of said bipolar transistor, and the other end of which is grounded.

11. The modulation circuit according to claim 9, wherein said modulating wave input means comprises a capacitor, one end of which is connected to said modulating wave input terminal, and the other end of which is grounded; and an inductor, one end of which is connected to said modulating wave input terminal, and the other end of which is connected to said collector terminal of said bipolar transistor.

12. The modulation circuit according to claim 9, wherein said self-bias means comprises a first resistance element, one end of which is connected to said modulating wave input terminal, and the other end of which is connected to said base terminal of said bipolar transistor; a second resistance element, one end of which is connected to said base terminal of said bipolar transistor, and the other end of which is grounded; and a third resistance element, one end of which is connected to the emitter terminal of said bipolar transistor, and the other end of which is grounded.

13. The modulation circuit according to claim 9, comprising a bypass capacitor one end of which is connected to the emitter terminal of said bipolar transistor, and the other end of which is grounded.

14. The modulation circuit according to claim 9, wherein said carrier selection means comprises an inductor, one end of which is connected to said modulating wave input terminal, and the other end of which is connected to said collector terminal of said bipolar transistor; and a capacitor, one end of which is connected to said collector terminal of said bipolar transistor, and the other end of which is grounded.

15. The modulation circuit according to claim 9, wherein said modulated wave output means comprises a capacitor one end of which is connected to said collector terminal of said bipolar transistor, and the other end of which is connected to said modulated wave output terminal.

16. The modulation circuit according to claim 1, composed of a monolithic microwave integrated circuit.

* * * * *